US00H002212H

(19) United States

(12) Statutory Invention Registration

Walton et al.

(10) Reg. No.: US H2212 H

(43) Published: Apr. 1, 2008

(54) METHOD AND APPARATUS FOR PRODUCING AN ION-ION PLASMA CONTINUOUS IN TIME

(75) Inventors: Scott G. Walton, Burke, VA (US); Robert Meger, Crofton, MD (US); Richard Fernsler, Annanadale, VA (US); Darrin Leonhardt, Gaithersburg, MD (US)

(73) Assignee: The United States of America as represented by the Secretary of the Navy, Washington, DC (US)

(21) Appl. No.: 10/672,269

(22) Filed: Sep. 26, 2003

(65) Prior Publication Data

US 2005/0067099 A1 Mar. 31, 2005

(51) Int. Cl.

*C23F 1/00* (2006.01)

*C23C 16/00* (2006.01)

(52) U.S. Cl. ..... 156/345.4; 216/67; 118/723 FE

(58) Field of Classification Search ..... 156/345.4; 216/67; 118/723 FE

See application file for complete search history.

(56) References Cited

U.S. PATENT DOCUMENTS

| | | | | | |
|---|---|---|---|---|---|
| 4,509,451 | A | * | 4/1985 | Collins et al. | 118/50.1 |
| 5,182,496 | A | | 1/1993 | Manheimer et al. | |
| 5,413,663 | A | * | 5/1995 | Shimizu et al. | 156/345.4 |
| 5,601,653 | A | * | 2/1997 | Ito | 118/723 FE |
| 5,639,308 | A | * | 6/1997 | Yamazaki et al. | 118/723 FE |
| 5,874,807 | A | | 2/1999 | Neger et al. | |
| 5,983,828 | A | * | 11/1999 | Savas | 118/723 I |
| 6,054,063 | A | * | 4/2000 | Ohtake et al. | 216/70 |
| 6,410,450 | B2 | * | 6/2002 | Kitagawa | 438/710 |
| 6,875,700 | B2 | * | 4/2005 | Kanakasabapathy et al. | 438/710 |
| 2002/0114898 | A1 | * | 8/2002 | Karner et al. | 427/578 |

OTHER PUBLICATIONS

Webster's New World dictionary, The World Publishing Company, 1972. p. 68.*

Walton et al., "Ion flux and energy distributions at electrode surfaces in LAPPS" Pulsed Power Plasma Science, 2001. IEEE Confrence Record—Abstracts, p. 385 (Jun. 2001).*

S. G. Walton, D. Leonhardt, R. F. Fernsler and R. A. Meger, "Extraction of Positive and Negative ions from Electron–Beam–Generated Plasmas," Applied Physics Letters 81(6), 987–989 (Aug. 2002).

S. G. Walton, D. Leonhardt, R. F. Fernsler and R. A. Meger, "On the Extraction of Positive and Negative ions from Electron–Beam–Generated Plasma," Applied Physics Letters 83(4), 626–628 (Jul. 2003).

(Continued)

*Primary Examiner*—Michael J. Carone

(74) *Attorney, Agent, or Firm*—John Karasek

(57) ABSTRACT

An ion-ion plasma source, that features a processing chamber containing a large concentration of halogen or halogen-based gases. A second chamber is coupled to the processing chamber and features an electron source which produces a high energy electron beam. The high energy electron beam is injected into the processing chamber where it is shaped and confined by a means for shaping and confining the high energy electron beam. The high energy electron beam produced in the second chamber when injected into the processing chamber ionizes the halogen gas creating a dense, ion-ion plasma in the processing chamber that is continuous in time. A method for creating an ion-ion plasma continuous in time.

3 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OTHER PUBLICATIONS

R. F. Fernsler, W. M. Manheimer, R. A. Meger, J. Mathew, D. P. Murphy, R. E. Pechacek, and J. A. Gregor, "Production of Large–Area Plasmas by Electron Beams," Physics of Plasmas 5(5), 2137–2143 (1998).

W. M. Manheimer, R. F. Fernsler, M. Lampe and R. A. Meger, "Theoretical Overview of the Large–Area Plasma Processing System (LAPPS)," Plasma Sources Science and Technology 9, 370–386 (2000).

R. A. Meger, D. D. Blackwell, R. F. Fernsler, M. Lampe, D. Leonhardt, W. M. Manheimer, D. P. Murphy and S. G. Walton, "Beam–Generated Plasmas for Processing Applications," Physics of Plasmas 8(5), 2558–2564 (2001).

D. Leonhardt, C. Muratone, S. G. Walton, D. D. Blackwell, R. F. Fernsler and R. A. Meger, "Generation of Electron–Beam Produced Plasmas and Applications to Surface Modification," Surface Coatings and Technology 177–178, 682–687 (2004).

M. V. Malyshev, V. M. Donnelly and J. I. Colonell, "Dynamics of Pulsed–Power Chlorine Plasmas," Journal of Applied Physics 86(9), 4813–4820 (1999).

S. K. Kanakasabapathy, L. J. Overzet, V. Midha and D. Economou, "Alternating Fluxes of Positive and Nagative Ions from an Ion–Ion Plasma," Applied Physics Letters 78(1), 22–24 (2001).

T. H. Ahn, K. Nakamura and H. Sugai, "Negative Ion Measurements and Etching in a Pulsed–Power Inductively Coupled Plasma in Chlorine," Plasma Sources Science and Technology 5, 139–144 (1996).

D. Leonhardt; S.G. Walton;; D.D. Blackwell; D.P. Murphy; R.F. Fernsler; R.A Meger; "Ion–ion plasmas from discharges based on electron beam ionization" Pulsed Power Plasma Science, 2001. IEEE Conference Record—Abstracts, p. 158 (Jun. 2001).

* cited by examiner

METHOD AND APPARATUS FOR PRODUCING AN ION-ION PLASMA CONTINUOUS IN TIME

FIELD OF THE INVENTION

This invention relates in general to the field of material processing and in particular to the field of using ion-ion plasma source for etching materials.

BACKGROUND OF THE INVENTION

Plasmas are widely used to modify the surface properties of materials and are now indispensable in etching sub-micron features. These features are created using a mask to define the feature, reactive neutrals (radicals) to attack the unmasked areas chemically, and energetic ions to remove the debris and provide directionally. The plasma provides both the ions and radicals. In conventional etchers the ions are almost always positive and are accelerated onto the materials by an electric field. Because most materials being etched are poor conductors, a negative current must accompany the positive ion current, to avoid charging the surface. The simplest solution is to apply rf fields that drive positive ions into the material during one part of the rf cycle and negatively charged particles during the other part. The rf frequency most commonly used is 13.56 MHz.

Conventional etchers use electromagnetic fields to heat plasma electrons to ionize a background gas, and the plasmas thus formed necessarily contain large numbers of free electrons. In electronegative gases, some of the electrons attach to the molecules to form negative ions, but the electrons continue to carry most of the negative rf current because the ions are much heavier and less mobile. Moreover, the electrons generate an electrostatic field that prevents negative ions from leaving the plasma. The positive ions and free radicals then do the actual etching of reactive material in contact with the plasma, while the electrons neutralize any bulk charge left on the surface of the material. Negative ions, while often present, are unsued in conventional etchers.

Using electrons to neutralized positive surface charge works well for large-scale features but not small-scale features. This is because the light and hot electrons flow in all directions, whereas the cold and massive ions are driven directly toward the material by the applied and self-fields. The ions therefore preferentially strike the bottom of a deep narrow trench, whereas spread out and strike the side walls of the trench. The bottom of the trench thus charges positively while the side walls charge negatively, and this difference in charge generates a transverse electrostatic field that deflects ions into the side walls. The side wall then begin to etch and erode, thus deforming the trench. Deep narrow trenches with straight side walls are therefore difficult to form with electron-ion plasmas.

One possible solution is to use negative ions rather than electrons to neutralize the surface charge. This requires an ion-ion plasma consisting mainly of positive and negative ions but few electrons. Unlike electrons, negative ions flow directly into a material when accelerated through a thin, electrostatic sheath adjacent to the material. Moreover, negative ions etch as well as, and possibly better than, positive ions. In ion-ion plasmas, positive ions flow toward the material during one half cycle of the rf field, while negative ions flow during the other half cycle. However, the rf frequency must now be reduced to 1 MHz or less, to give the massive ions time to respond to the fields. Also, square rf pulses can be used in place of sinusoidal pulses, to reduce the energy spread of the ions and thereby improve etch selectively in different materials. Since both current carriers are now directed toward the material, deeper and narrower channels can be formed using ion-ion plasmas. The aspect ratio ultimately achievable is then limited by chemical etching from the isotropic radicals alone. This limit, which has yet to be reached in present-day etchers, is approached with ion-ion plasmas provided the ions are cold and traverse the rf sheath while suffering few collisions.

Conventional electromagnetic discharge sources use hot electrons to generate a discharge and thus naturally generate electron-ion plasmas. These sources include capacitively coupled discharges, inductively coupled discharges, helicons, surface waves, and electron-cyclotron-resonance reactors. However, if the electromagnetic heating fields are turned off, the plasma will convert into an ion-ion plasma in many of the halogen-based gases commonly used for etching. This is because, the dissociative attachment rate rises, in these gases, as the electrons temperature drops, and thus the electrons attach during the afterglow ("off" phase) to form negative ions. Pulsing any conventional source can thus produce an ion-ion plasma late in the afterglow. When the heating fields are on, the electrons are hot and produce an electron-ion plasma. When the heating fields are off, the electrons cool, the plasma decays, and an ion-ion plasma eventually forms. However, because the electrons are hotter and more mobile than the ions, this conversion typically occurs only late in the afterglow when the electron density has fallen to several orders of magnitude below the ion density. Only at that point are negative ions able to leave the plasma.

The Charged Particle Physics Branch (Code 6750) at the Naval Research Laboratory has developed a plasma source for etching called the Large Area Plasma Processing System (LAPPS). This system is the subject of U.S. Pat. Nos. 5,182,496 and 5,874,807, both of which are incorporated herein by reference, in their entireties. This plasma source uses a magnetically confined, sheet electron beam to ionize a background gas and produce a planar electron/ion plasma. Electron beams exhibit high ionization and dissociation efficiency of the background gas. In addition, the plasma production process is largely independent of the ionization energies of the gas or the reactor geometry. Since the plasma volume is limited only by beam dimensions, the usable surface area of the plasma thus can exceed that of other plasma sources.

Although pulsing a conventional plasma source can produce ion-ion plasmas, the technique suffers from several serious limitations. One limitation is that hot electrons drive the ion flux during the electron-ion phase, whereas cold ions drive the ion flux during the ion-ion phase. As a result, the ion flux during the electron-ion phase is orders of magnitude larger than the ion flux during the ion-ion phase. In addition, the ion-ion phase persist for only a brief portion of the afterglow and therefore for an even shorter portion of the total period. The net result is that most of the etching occurs during the electron-ion phase rather than during the ion-ion phase. The useful duty cycle and efficiency of ion-ion etching from conventional, pulsed sources is thus low. Nevertheless, despite these limitations, pulsed plasmas have been shown to improve etch quality.

Therefore, it would be desirable to produce an ion-ion plasma with a high degree of control that is continuous in time.

SUMMARY OF THE INVENTION

Disclosed is an ion-ion plasma source featuring a processing chamber containing a large concentration of halogen or halogen-based gas. A second chamber is coupled to the processing chamber and features an electron source which produces a high energy electron beam. The high energy electron beam is injected into the processing chamber where it is shaped and confined by a means for shaping and confining the high energy electron beam. The high energy electron beam produced in the second chamber when injected into the processing chamber ionizes the halogen gas creating a dense ion-ion plasma in the processing chamber that is continuous in time.

Also disclosed is a method for creating an ion-ion plasma continuous in time comprising a processing chamber containing a large concentration of at least one halogen gas and a second chamber coupled to the processing chamber. Creating a high energy electron beam in the second chamber, injecting the high energy electron beam into the processing chamber, shaping the high energy electron beam injected into the processing chamber with a magnetic field. Wherein the high energy electron beam injected into the processing chamber ionizes the halogen gas creating a dense ion-ion plasma in the processing chamber that is continuous in time.

DETAILED DESCRIPTION

Figure 1:
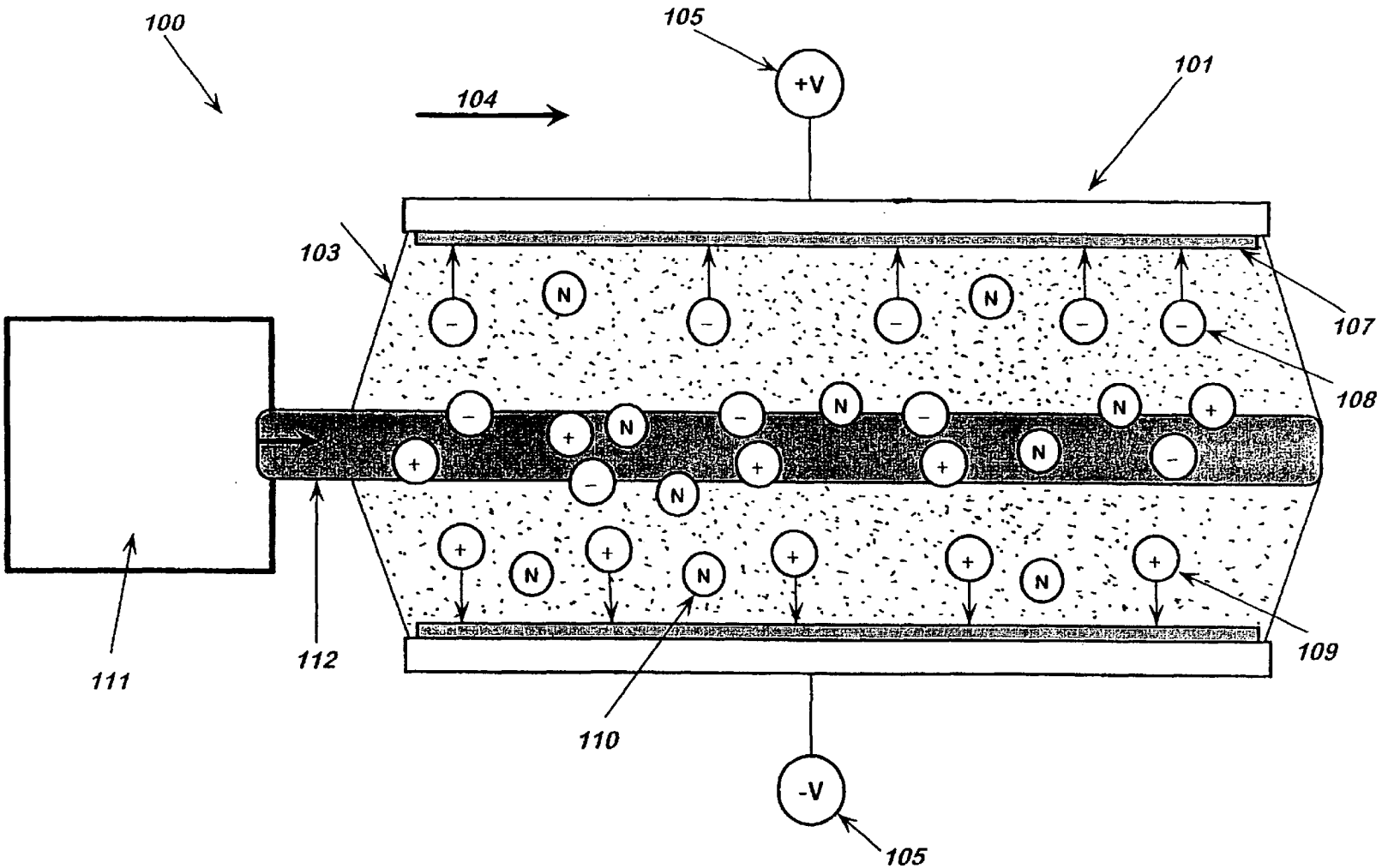
FIG. 1 shows an apparatus for producing an ion-ion plasma continuously in time.

Referring to the figures wherein like reference numbers denote like elements, FIG. 1 shows an example embodiment of CIIPS, an apparatus for producing and ion-ion plasma 100 that is continuous in time.

As shown in FIG. 1, plasma source 100 features a processing chamber comprising 101, having therein a large concentration of a halogen-based gas. A second chamber 111 is coupled to the processing chamber 101 and contains therein an electron source which provides a high energy electron beam 112, in the second chamber 111. Processing chamber 101 features the high energy electron beam confiner which in the example embodiment is a longitudinal magnetic field applied to the surface of the chamber wall in the direction of propagation. The longitudinal magnetic field generally is externally generated, and applied to keep the beam from expanding and striking the substrate, and to keep the beam current density, and thus the plasma density approximately constant as the beam propagates, and to retard the outward flow of the plasma electrons. In an example embodiment, the magnetic field is produced by positioning magnetic field coils, or possibly permanent magnets, along to direction of electron beam propagation.

In operation the high energy electron beam 112 produced in the second chamber 111 is injected into the processing chamber 101 and is confined transversely by the magnetic field. The confined high energy electron beam 112 in the processing chamber 101 ionizes the gases creating a dense, ion-ion plasma 103 in the processing chamber. The ion-ion plasma is produced continuously in time. The high energy electron beam 112 injected into the processing chamber 101 creates a ion-ion plasma 103 by dissociating the molecules of the halogen-based gas into a group of cold plasma electrons, free electrons and positive ions 109. Specifically, the plasma electrons and positive ions 109 are created through ionization, while neutral radicals are created through the disassociation of the halogen molecules. The cold free electrons (1 ev) created in the plasma attach to halogen molecules to form negative ions 108. This produces a dense plasma 103 that features a large concentration of positive ions 109, negative ions 108 and neutral 110.

The processing chamber radicals features two or more planar substrate stages (not shown). These substrate stages are closely spaced to provide room for the electron beam to pass between them. The material to be processed 107 is placed on one or more of the stages and an rf voltage 105 is applied as necessary to accelerate the ions, 108 and 109 onto the material being processed 107.

The distance from the electron beam 112 to the substrate stage provides additional control over the particle fluxes, separate from the beam and gas parameters. Typically the stages sit 1 cm. or more from the electron beam 112 in order to prevent the beam 112 from striking the material being processed 107.

CIIPS employs a magnetically confined sheet electron beam to ionize and dissociate a background gas. CIIPS produces a continuous ion-ion plasma rather than an electron-ion plasma, by using a gas mixture containing a large concentration of halogen gas with a large attachment cross section at electron energies below 1 eV. Candidate gases include $SF_6$, $Cl_2$ and $F_2$.

The high energy electron beam is confined transversely by a longitudinal magnetic field to maintain plasma uniformity over a large area, to prevent the beam from striking the substrate, and to reduce the flux of plasma electrons to the substrates. These features minimize the loss of electron energy.

The electron beam may be produced in a chamber separated from the processing chamber by differential pumping as indicated in FIG. 1. This feature helps to minimize gas contamination and improves processing control. The high energy electron beam within the second chamber is approximately 2000 eV. This energy level can vary depending on the gas pressure and the system length.

In a preferred embodiment the high energy electron beam employed by the disclosed ion-ion method has an energy level approaching 2000 eV. As such, the ionization energies of the gases can differ widely, since the electron beam has sufficient energy to ionize and dissociate any and all gases. Moreover, the ionization and disassociation rates of a given gas constituent are largely determined by the concentration of that constituent for a given electron beam, which allows the processing chamber to be populated with a wide mixture of halogen gases. By contrast, prior methods were often restricted to the use of halogen gases with similar electron bond strength. In the present invention, the option of varying the gas mixture provides direct control over the plasma constituents and the plasma chemistry.

The beam energy is nominally a few keV or less, the beam current density is typically 0.1 $A/cm^2$ or less, the gas pressure in the processing chamber is typically 50 mtorr, and the magnetic field along the beam is around 200 G. The beam is normally a few cm thick and arbitrarily wide, as determined by the chamber size and appication. The magnetic field is applied to keep the beam thickness approximately constant over the beam range. For the parameters specified the beam range is 1 m or more, and the ion density produced is as high as $2\times10^{12}$ $cm^{-3}$. CIIPS can thus generate dense, uniform, ion-ion plasmas over processing areas as large as 1 $m^2$ or more.

In a preferred embodiment the electron beam is shaped into a thin sheet. The sheet beam can be produced in a variety of ways, and two methods have been successfully demonstrated and are shown in FIGS. 2 and 3.

Figure 2:
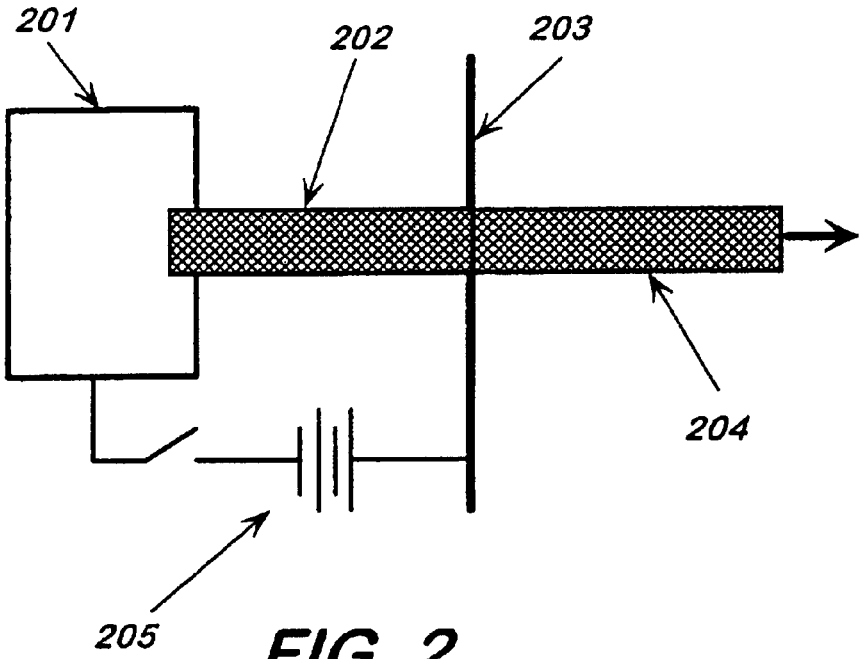
FIG. 2 shows an example beam source for producing a high energy electron beam.

FIG. 2 shows an example beam source used to produce a high energy electron beam. Referring to FIG. 2 a high-voltage discharge 202, produced by high voltage source 205, is struck between a long, hallow cathode 201 and a slotted anode 203. A portion of the discharge current emerges in the form of an energetic electron beam 204 that passes through the slot into the processing chamber, while the remainder of the discharge current flows to the anode 203.

Figure 3:
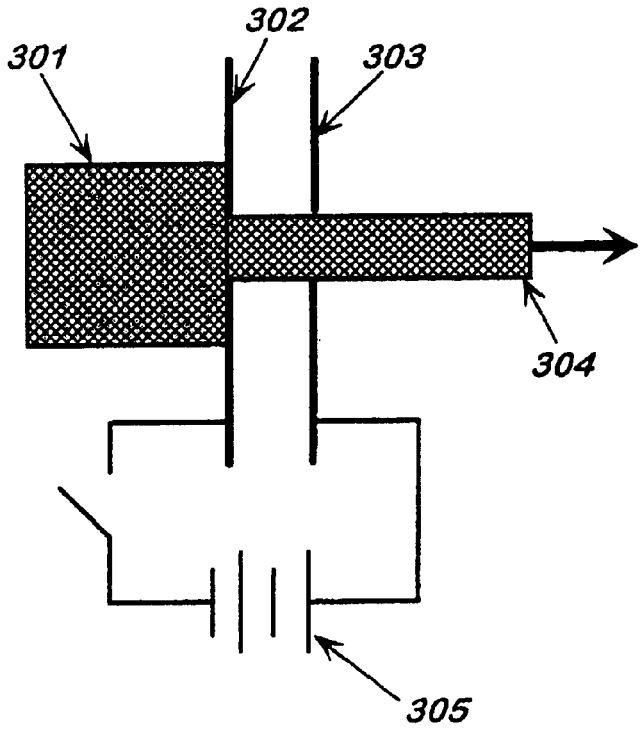
FIG. 3 shows a second example beam source for producing a high energy electron beam.

FIG. 3 shows a second example beam source for producing a high energy electron beam. Referring to FIG. 3, electrons are extracted from a dense plasma or other electron source 301 and then accelerated by a high voltage 305 applied to a nearby grid 302 or slot 303. Both methods are capable of generating electron beams of the required energy and current density at gas pressures below 300 mtorr.

Referring again to FIG. 1, the magnetic field is applied to the electron beam 112 to prevent the beam from striking the stage or the material being processed 107, and to keep the beam current density approximately constant over the propagation length, an to reduce the outward flow of plasma electrons. A field of around 200 G keeps the beam gyroradius under 1 cm, which is generally sufficient for CIIPS. The field strongly retards the flow of plasma electrons but has little effect on the massive ions, and as a result, negative ions can escape the plasma and strike the substrate 107 more easily than in other plasma sources.

As the electron beam 112 collides with the halogen and other gas molecules, it generates ions, electrons, and radicals through ionization and dissociation. At the same time, gas flow keeps the gas cold and the degree of ionization and dissociation low. The plasma electrons therefore cool rapidly and attach to form negative ions, thereby producing a weakly ionized but dense plasma 103 consisting mainly of positive 109 and negative ions 108 and neutral radicals 110. As these particles diffuse out of the plasma, they etch any reactive material they contact.

The etch rate may be increased by placing the material on a stage to which rf is applied at a frequency approximately $\leqq$1 MHz. The rf voltage increases the energy of the ions (to typically 20 eV or more) striking the material. At low gas pressure, the rf sheath is thinner than the ion mean free path, and thus isotropic radicals together with energetic and highly anisotropic, positive and negative ions strike the material. As previously noted, the ion flux from an ion-ion plasma is much smaller than that from an electron-ion plasma of the same density, and thus the etch rate is smaller as well. The reduction in etch rate is partially offset by a reduction in substrate heating, and the etch rate can be increased to some extent by raising the beam current to increase the plasma density.

The method for creating an ion-ion plasma continuous in time comprises a processing chamber containing a large concentration of at least one halogen gas, and a second chamber coupled to the processing chamber. The method includes creating a high energy electron beam in the second chamber and injecting the high energy electron beam into the processing chamber. After the electron beam is injected into the chamber the next step is shaping the high energy electron beam injected into the processing chamber with a magnetic field. The high energy electron beam injected into the processing chamber ionizes the halogen gas, creating a dense ion-ion plasma in the processing chamber that is continuous in time.

The high energy electron beam injected into the processing chamber creates a ion-ion plasma by dissociating the molecules of the halogen gas into a group of cold plasma electrons, free electrons and positive ions, and the cold free electrons created in the plasma attach to halogen molecules forming negative ions producing a dense plasma comprising a large concentration of positive and negative ions and neutral radicals. The high energy electron beam within the second chamber is approximately 2000ev. The processing chamber contains a multitude of halogen gases.

The high energy electron beam is shaped and confined by a magnetic field which provides uniformity over a large area and minimizes the loss of electron energy.

Although this invention has been described in relation to the exemplary embodiment's thereof, it is well understood by those skilled in the art that other variations and modifications can be affected on the preferred embodiment without departing from scope and spirit of the invention as set fourth in the claims.

What is claimed is:

1. An ion-ion plasma source, comprising:

a processing chamber comprising halogen based gas;

an electron source operable to provide an electron beam in said processing chamber, the electron beam having a current density of approximately 0.1 A/cm$^2$; and an electron beam confiner operable to apply a magnetic field at the electron beam to generate a confined electron beam in said processing chamber, to ionize the halogen based gas to generate an ion-ion plasma that substantially comprises negative ions.

2. The ion-ion plasma source of claim 1, wherein said processing chamber is operable to maintain a gas pressure of approximately 50 mtorr.

3. An ion-ion plasma source, comprising:

a processing chamber comprising halogen based gas;

an electron source operable to provide an electron beam in said processing chamber, the electron beam having a current density of approximately 0.1 A/cm$^2$; and an electron beam confiner operable to apply a magnetic field at approximately 200 G, to generate a confined electron beam in said processing chamber, to ionize the halogen based gas to generate an ion-ion plasma that substantially comprises negative ions.

* * * * *